US009439295B2

(12) United States Patent
Lazarus et al.

(10) Patent No.: US 9,439,295 B2
(45) Date of Patent: Sep. 6, 2016

(54) ELECTRICALLY INSULATING ELEMENTS AND ELECTRICALLY CONDUCTIVE ELEMENTS FORMED FROM ELEMENTS HAVING DIFFERENT OXIDATION BEHAVIORS

(71) Applicant: U.S. Army Research Laboratory, Adelphi, MD (US)

(72) Inventors: Nathan S. Lazarus, Bethesda, MD (US); Christopher D. Meyer, Bethesda, MD (US); Sarah S. Bedair, Bethesda, MD (US)

(73) Assignee: The United States of America as Represented by the Secretary of the Army, Washington, DC (US)

( * ) Notice: Subject to any disclaimer, the term of this patent is extended or adjusted under 35 U.S.C. 154(b) by 625 days.

(21) Appl. No.: 13/870,018

(22) Filed: Apr. 25, 2013

(65) Prior Publication Data
US 2014/0321032 A1    Oct. 30, 2014

(51) Int. Cl.
| | |
|---|---|
| H01C 17/02 | (2006.01) |
| H05K 3/22 | (2006.01) |
| B81C 1/00 | (2006.01) |
| G01C 25/00 | (2006.01) |
| H05K 1/16 | (2006.01) |

(52) U.S. Cl.
CPC ............. H05K 3/22 (2013.01); B81C 1/00095 (2013.01); G01C 25/00 (2013.01); H05K 1/165 (2013.01); H05K 2201/0394 (2013.01); H05K 2203/0315 (2013.01); Y10T 29/49002 (2015.01)

(58) Field of Classification Search
CPC .......... H05K 7/00; H05K 3/105; H05K 3/10; H05K 3/22; H05K 1/165; H05K 2201/0394; H05K 2203/0315; B81B 7/00; B81C 1/00; Y10T 29/49087; Y10T 29/49082; Y10T 29/49002; Y10T 29/49
USPC ....... 29/613, 610.1, 592.1, 592; 361/679.01; 205/333, 316, 80, 538, 477; 427/584
See application file for complete search history.

(56) References Cited

U.S. PATENT DOCUMENTS

| | | | |
|---|---|---|---|
| 5,726,073 A | 3/1998 | Zhang et al. | |
| 6,239,473 B1 | 5/2001 | Adams et al. | |
| 6,369,410 B1 * | 4/2002 | Yamazaki | H01L 29/458 257/412 |

(Continued)

OTHER PUBLICATIONS

Li J, Mayer J, and Colgan E, "Oxidation and protection in copper and copper alloy thin films," J. Appl. Phys., 70, (1991) 2820-2827.
Hutt D and Liu C, "Oxidation protection of copper surfaces using self-assembled monolayers of octadecanethiol," Applied Surface Science, 252 (2005) 400-41.

(Continued)

*Primary Examiner* — Peter DungBa Vo
*Assistant Examiner* — Azm Parvez
(74) *Attorney, Agent, or Firm* — Eric Brett Compton

(57) ABSTRACT

Embodiments of the present invention are directed to electrical devices and methods for fabricating electrical devices using an oxidation process. According to one embodiment, a method of forming an electrical device using an oxidation process includes forming a metallic element which is to become an electrically insulating or resistive element in an electrical device; forming an electrically conductive element connected to the metallic element, wherein the metallic element and the electrically conductive element have different oxidation behavior when subjected to the oxidation process; and subjecting the elements forming the electrically insulating or resistive element and the electrically conductive element to the oxidation process.

25 Claims, 9 Drawing Sheets

(56) References Cited

U.S. PATENT DOCUMENTS

| | | |
|---|---|---|
| 6,962,831 B2 | 11/2005 | Najafi et al. |
| 7,666,688 B2 | 2/2010 | Ching et al. |
| 7,824,098 B2 | 11/2010 | Melamud et al. |
| 8,031,037 B2 | 10/2011 | Sherrer et al. |
| 2011/0284386 A1* | 11/2011 | Willey .................... C25D 3/38 205/96 |

OTHER PUBLICATIONS

Meyer C.D. et al. "High-inductance-density, air-core, power inductors and transformers designed for operation at 100-500 MHz," IEEE Trans. On Magnetics, 46, (2005) 2236-2239.

Y. Zhu, K. Mimura, J. Lim, M. Isshiki, and Q. Jiang, "Brief review of oxidation kinetics of copper at 350° C. to 1 050° C.," Metallurgical and Materials Transactions A, vol. 37 A, Apr. 2006 pp. 1231-1237.

* cited by examiner

Before Oxidation (a)    After Oxidation (b)

Before Oxidation (c)    After Oxidation (d)

(e)

(a)

(b)

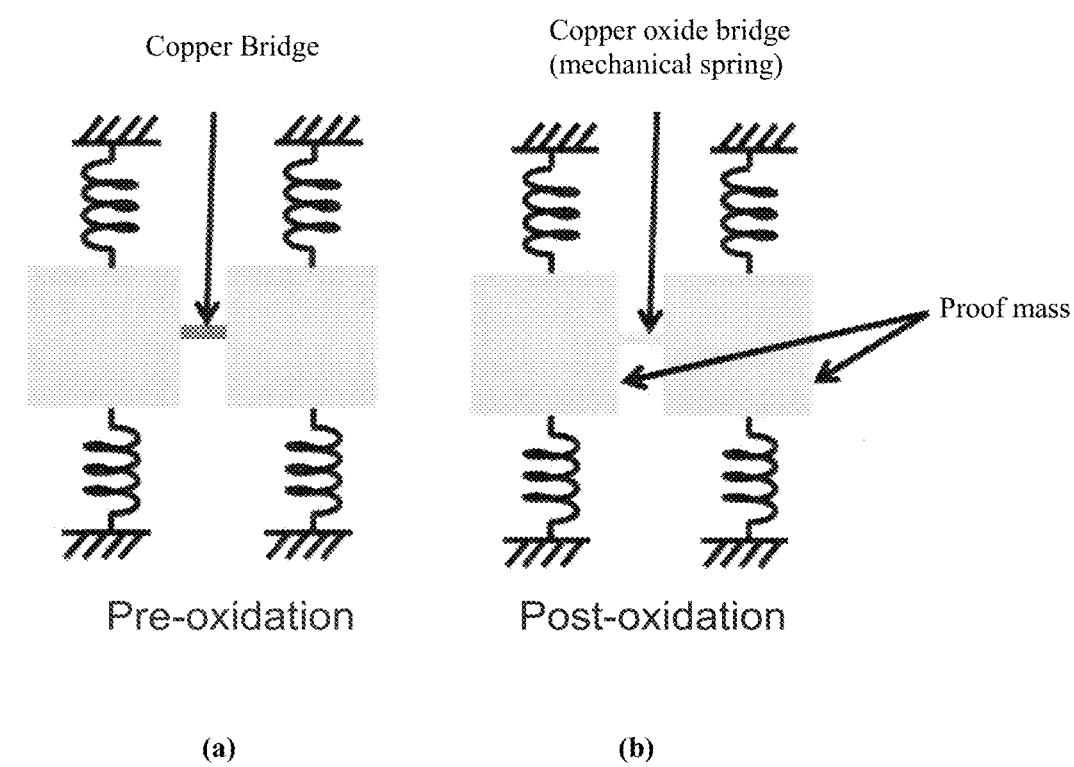
FIGURE 13
(Conventional)

ELECTRICALLY INSULATING ELEMENTS AND ELECTRICALLY CONDUCTIVE ELEMENTS FORMED FROM ELEMENTS HAVING DIFFERENT OXIDATION BEHAVIORS

GOVERNMENT INTEREST

The invention described herein may be manufactured, used and licensed by or for the U.S. Government without the payment of royalties thereon.

Research underlying this invention was sponsored by the U.S. Army Research Laboratory under Cooperative Agreement Number W911NF-12-2-0019.

BACKGROUND OF THE INVENTION

1. Field

Embodiments of the present invention are generally directed to electrical device fabrication, and more particularly to, the formation of electrically insulating elements and electrically conductive elements from elements having different oxidation behaviors which are subjected to an oxidation process.

2. Description of Related Art

Plated metal processes are heavily used in micro-electrical-mechanical system (MEMS) power and radio frequency (RF) components due to their low resistances and correspondingly low power losses. For large free-standing devices, mechanical supports are often necessary to improve robustness and to prevent deflection and shorting with neighboring structures. Since electroplated metals are conductive, creating resistive or dielectric supports has traditionally been done by the deposition and patterning of additional dielectric materials such as polymers or plastics. An alternative means of creating a resistive or dielectric support is to convert an electrically conductive element to a more resistive material by an oxidation process. The oxidation of silicon to silicon oxide to create dielectric mechanical supports has been previously demonstrated in microstructure fabrication. For some applications, a trench may be filled with silicon oxide through thermal oxidation and used to form the mechanical anchor of a micromechanical structure. Alternatively, silicon beams and mechanical supports can be directly converted to silicon oxide to form dielectric mechanical supports. Other prior work has also demonstrated the use of oxidation of silicon to create silicon oxide mechanical structures such as membranes. Although many metals also form thick oxides, this has typically been viewed as a major problem, especially in MEMS packaging where exposure to temperatures of several hundred degrees Celsius may be required, and has not been previously relied upon to create mechanical structures.

SUMMARY OF THE INVENTION

Embodiments of the present invention are directed to electrical devices and methods for fabricating electrical devices using an oxidation process.

According to one embodiment, a method of forming an electrical device using an oxidation process includes forming a metallic element which is to become an electrically insulating or resistive element in an electrical device; forming an electrically conductive element connected to the metallic element, wherein the metallic element and the electrically conductive element have different oxidation behavior when subjected to the oxidation process; and subjecting the elements forming the electrically insulating or resistive element and the electrically conductive element to the oxidation process.

The method may further include, in some embodiments, subjecting one or both of the metallic elements forming the electrically insulating or resistive element and the electrically conductive element to a release step whereby the elements become free-standing, suspended, or released, from a substrate or at least one other element of the electrical device. The release step may include removing a supporting mold, the etching of a sacrificial layer, or the detachment from the underlying substrate or the at least one other element of the electrical device. This step may be performed before, during, and/or after the oxidation process. In a case in which the metallic element forming the electrically insulating or resistive element is released it may form a pillar, post, beam, column or flexure structure in the electrical device. Alternatively or additionally, one or both of the metallic elements forming the electrically insulating or resistive element and the electrically conductive element can be fabricated as a free-standing or suspended structure without the need for a separate release step. This may occur where the elements is free-standing or suspended by simply stacking up piles of material, for example.

In some embodiments, the metallic element forming the electrically insulating or resistive element is a metal which readily oxidizes during the oxidation process and the metallic element forming the electrically conductive element is a metal or other material which does not readily oxidize during the oxidation process. For example, the metal which readily oxidizes during the oxidation process may be copper, nickel, titanium, zirconium, hafnium, tantalum and niobium, and the metal which does not readily oxidize during the oxidation process may be gold, nickel, aluminum, or platinum. The non-readily oxidizing conductive element may also be a non-metallic material such as polysilicon in some applications. Since metals oxidize differently in different temperature ranges, a metal such as nickel, can be a non-readily oxidizing metal when combined with a metal such as copper that forms thick oxides at lower temperatures. Nickel, when combined with a metal such as gold or platinum that oxidize less easily, can also be used as a readily oxidizing metal when baked to higher temperatures.

In other embodiments, the metallic elements forming electrically insulating or resistive element and the electrically conductive element are each formed from a metal which readily oxidizes during the oxidation process, but these elements perform in a different manner. The oxidizing metal may be copper, for example, but these metallic elements have different dimensions and/or sizes which provide different oxidation behaviors when they are subjected to the oxidation process. For example, the metallic element forming the electrically conductive element may have a greater thickness or diameter than the metallic element forming the electrically insulating or resistive element. As such, the metallic element forming the electrically insulating or resistive element is substantially converted to a metal oxide, whereas the metallic element forming the electrically conductive element may only be partially converted to a metal oxide so as to remain conductive. During the oxidation process, only a surface layer of the metal from which the conductive element is formed may be substantially converted to a metal oxide. The metallic element forming the electrically insulating or highly resistive element, the electrically conductive element, or both, may be deposited by electroplating. The oxidation process may include a bake at an elevated temperature, exposure to oxygen plasma, or exposure to ozone.

Another embodiment consists of forming both the conductive and electrically insulating or resistive elements from readily oxidizing metals, but the conducting element undergoes a surface treatment or coating to limit oxidation. For instance, the metallic element forming the electrically insulating or resistive element and the electrically conductive element may be differentiated by coating the surface of the conductive element. Regions could be coated with a layer of another material to prevent the oxidizing metal from being exposed to oxygen during the oxidation process. The surface coating may include octadecanethiol or a non-oxidizing metal.

According to other embodiments, an electrical device formed by the oxidation process may include, for instance, at least one electrically insulating or resistive element and at least one electrically conductive element connected to the electrically insulating element. The insulating or resistive element is formed of a metallic element and the conductive element consists of a different material which has a different oxidation behavior when subjected to an oxidation process. One embodiment of the conducting element that oxidizes differently would be another metal that does not readily oxidize during the oxidation process. During oxidation, the elements forming the insulating elements and the conductive elements behave differently. The electrical devices may be configured as an inductor, gyroscope, accelerometer, chemical sensor, pressure sensor, or variable capacitor.

These and other embodiments of the present invention(s) are described in more detail below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments, including less effective but also less expensive embodiments which for some applications may be preferred when funds are limited. These embodiments are intended to be included within the following description and protected by the accompanying claims.

FIG. 13 shows a schematic for a dual-proof mass gyroscope topology made by oxidizing a copper beam.

DETAILED DESCRIPTION OF THE INVENTION

Figure 1:
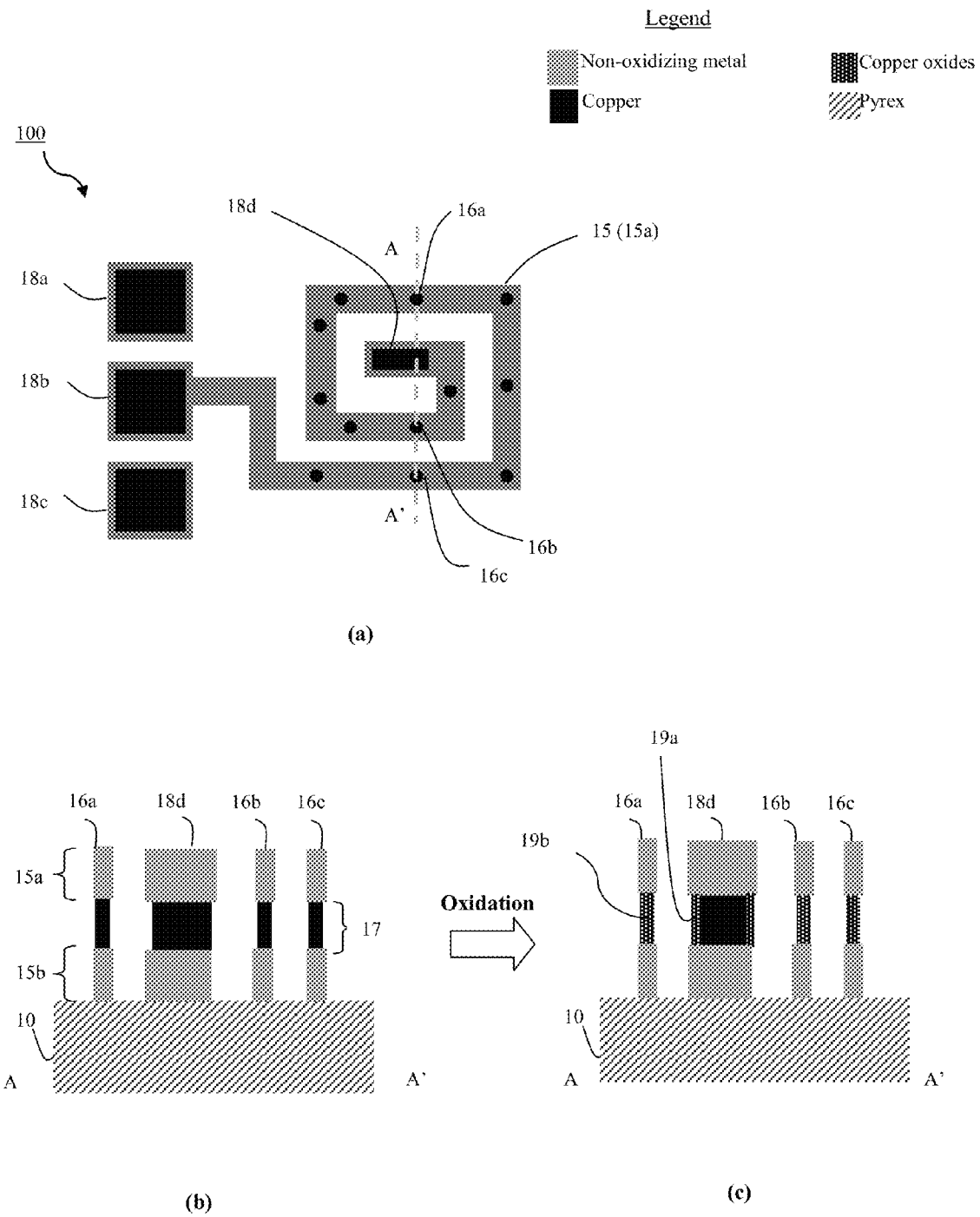
FIGS. 1A-1C show a suspended inductor coil according to an embodiment.

Embodiments of the present invention are directed to electrical devices and methods for fabricating electrical devices using an oxidation process. According to various embodiments, the method of forming an electrical device using an oxidation process includes forming at least one metallic element which is to become an electrically insulating or resistive element in an electrical device and forming at least one electrically conductive element connected to the metallic element. The metallic elements and the electrically conductive elements have different oxidation behaviors when they are subjected to the oxidation process. Exploiting these different oxidation behaviors of the precursor elements, both (i) electrically insulating or resistive elements, and (ii) electrically conductive elements for electrical devices can be created in a single patterned layer. Advantageously, this methodology may be used to form various structures for electrical devices having both types of elements in a more simplified manner than previous performed.

Applications of the present invention may be configured for various small electrical structures that would benefit from having both low electrical resistance conductive pathways and insulating elements. This may benefit multiple types of electrodes in electrical devices including driving and sensing electrodes in the same structure, including but not limited to inductors, gyroscopes, accelerometers, chemical sensors, pressure sensors, and MEMS variable capacitors.

As will be appreciated by those in the art, an oxidizing process converts a material, such as a metal, into an oxide of the material. Copper (Cu) is one metal with may be readily oxidized converting copper to copper oxide. As mentioned above, the ability of copper to form thick layers of oxides has typically been viewed as a major problem, and thus avoided in prior method. However, the inventors have advantageously found this property can be leveraged in order to partially or completely oxidize structures larger than would be possible for other materials.

While various embodiments utilizing copper as an oxidizing metal are described herein, it should be appreciated that other oxidizing metals may also be used in accordance with the disclosed embodiments. Thus, any reference to copper as an oxidizing metal should not be construed as limiting. For instance, numerous other metals, including nickel, titanium, zirconium, hafnium, tantalum and niobium have; also been shown to form thick oxide layers in different temperature ranges, and may be used in other embodiments as an oxidizing metal.

For the purposes of this invention, an element or material may be considered electrically insulating or resistive if it substantially blocks and/or does not readily conduct electrical current during its ordinary operation(s) in an electrical device. Conversely, for purposes of this invention, an element or material may be considered electrically conductive if it readily conducts electrical current during its ordinary operation(s) in an electrical device. Such elements and materials may be characterized as having relatively low electrical insulating or resistive properties. The distinction between electrically insulating or resistive and electrically conductive is well-known and should be readily appreciated by those in the electrical arts.

In fact, many metal oxides typically have electrically insulating or resistive properties. As an example, if the resistivity of the metal oxide is at least two orders of magnitude (i.e., a factor of 100) greater than the resistivity of the original metal, then it should provide sufficient electrically insulating or resistive properties for purposes of this invention. More particularly, bulk copper has a resistivity of 16.73 n$\Omega$·cm, while the two majors forms of copper oxide, cupric oxide (CuO) and cuprous oxide ($Cu_2O$), have resistivity at least eight orders of magnitude higher, depending on growth conditions, and thus could be considered resistive in this invention. The element may be a dielectric material, in some instances, but this may not be necessary for many applications and/or electrical devices. Copper when subjected to an oxidation process forms a porous oxide, allowing the formation of oxide layers up to tens of microns thick or more to be created at modest processing temperatures. This controlled oxidation of copper (or other oxidizing metal) can be employed to create electrically insulating or resistive structural elements posts and beams according to embodiments. This capability can eliminate the additional dielectric (insulator) or resistive material deposition and patterning steps that are often needed during the construction of sensors, waveguides, and other micro-fabricated devices, thus simplifying the manufacturing process. The copper (or other electrically insulating or resistive material) may be applied by an electroplating process in some implementations.

Copper oxidation rates for thermal and plasma-assisted growth methods have been characterized by the inventors. Time control of the oxide growth enables larger copper structures to remain conductive while smaller copper posts are fully oxidized. This concept has been demonstrated using the controlled oxidation of a copper layer between two nickel layers to fabricate nickel inductors having both copper electrical vias and copper oxide support pillars. Here, nickel was utilized in this demonstration for its resistance against low temperature oxidation and interdiffusion with copper.

As one of the most conductive metals, copper is commonly used as a metallization layer for integrated circuits and MEMS. However, copper also oxidizes easily in the presence of oxygen. At temperatures up to about 275° C., copper forms a relatively dense oxide, largely $Cu_2O$, that helps to limit further oxidation beyond thicknesses on the order of tens to a few hundred nanometers. At higher temperatures, a more porous oxide consisting of a surface layer of CuO on a thicker layer of $Cu_2O$, is formed, with layer thicknesses of tens to hundreds of micrometers possible when baked for a few hours in the presence of oxygen. This oxidation can result in sizeable increases in the resistance of copper traces. These two major forms of copper oxide $Cu_2O$ and cupric oxide CuO, are both p-type semiconductors with resistivity at least eight orders of magnitude higher than copper metal. A number of methods have been developed to minimize oxidation, including alloying the copper surface with another metal and forming a surface passivation layer.

The method can further by used to create electrically insulating or resistive released structures by including a release step whereby the elements become free-standing, suspended, or released from a substrate or at least one other element of the electrical device. The released elements may include free-standing, suspended or released elements devices or other mechanical supports, for instance. A free-standing or suspended device is a structure that is able to support itself based on mechanical connections or springs to mechanical anchors. In MEMS devices, suspended metal micromechanical structures are typically held in place using molds, sacrificial layers or other attachment to the underlying substrates during much of the fabrication process. The step by which the device becomes suspended, such as an etch, removal of the surrounding mold, or detachment from the substrate, is known as the release step, and the final structure is then considered a released, or suspended element. The release step may include removing a supporting mold, the etching of a sacrificial layer, or the detachment from the underlying substrate. This step may be performed before, during, and/or after the oxidation process. In a case in which the metallic element forming the electrically insulating or resistive element is released it may form a pillar, post, beam, column or flexure structure in the electrical device. Mechanical supports can be similarly formed in this manner. Alternatively or additionally, elements of the electrical device can be fabricated as a free-standing or suspended structure without the need for a separate release step. This may occur where the element is free-standing or suspended by simply stacking up piles of material, for example, using a three-dimension (3D) printer.

In some embodiments, metallic copper may be used to form both the elements which are to become electrically insulating or resistive elements and the electrically conductive elements in an electrical device. By controlling the dimensions of precursor elements for the electrical device, copper structures can be partially and completely oxidized, allowing both conductive and highly resistive elements to be created in a single patterned layer. Advantageously, this methodology may be used to form suspended metal micromechanical structures having both insulating and conducive elements. Of course, in other embodiments, the electrically conductive element may be a metal or other material which does not readily oxidize during the oxidation process. For example, some metals which do not readily oxidize during the oxidation process may be gold, nickel, aluminum, or platinum. The non-readily oxidizing conductive element may also be a non-metallic material such as polysilicon in some applications.

FIGS. 1A-1C show a suspended inductor coil according to an embodiment. FIG. 1A shows a top view of the inductor coil 100. The inductor coil 100 generally is composed of a substrate 10, coils 15a, 15b, columns 16 supporting the coil in a fixed position above the substrate 10, and conductive pillars 18 electrically connecting the coils 15 to the conductive pathways (not shown) in the substrate 10 and/or elsewhere provided. Only the top coil 15a is visible in FIG. 1A. The tops of the suspension columns 16 appear as small circular elements ● from above. For ease of clarity, only the three suspension columns 16a, 16b, 16c along line A-A' have been annotated.

The material of the various elements: non-oxidizing metal, copper, copper oxide and glass is identified according to the accompanying legend. In some embodiments, the glass may be a low-thermal-expansion borosilicate glass, such as sold under the brand Pyrex®.

The suspended inductor coil may be formed of two coils 15a, 15b separated by copper metal 17. The copper metal 17 here has been initially patterned to include many smaller regions (for columns 16a, 16b, 16c) and a much larger or wider region (for pillars 18b, 18d). This is shown in more detail in FIG. 1B.

The coils 15a, 15b may be formed of conductive material, such as gold, in a spiral structure and spaced at a predetermined height in a parallel manner by columns 16 above the substrate 10. One possible embodiment would be layer thicknesses of roughly 10 micrometers. The completely oxidizing pillars could have diameter of 4 micrometers, while the partially oxidizing pillar could have diameter of 200 μm. The suspended coil could have line widths of 20 micrometers with 10 micrometers spacing between neighboring lines.

The copper metal 17 of the columns 16 will later be converted via an oxidation process to copper oxide, an electrically insulating or resistive material to keep the coil 15a, 15b electrically isolated from one another, and avoid shorting. The coils 15a, 15b connect to second and fourth pillars 18b and 18d, while the first and third pillar 18a, 18c are may be free-standing structures. The pillars 18 may be electrically conductive both before and after then oxidation process due to their construction.

It will be appreciated the number, size, shape and/or arrangement of the coils 15, columns 16 and conductive pillars 18 is exemplary only and may be different from what is shown in other embodiments. For example, the coils 15 may be circular instead of rectilinear, as shown, and have fewer or additional turns. And while four pillars 18 are shown, one pillar connected to the coil 15 may be all that is needed in some embodiments. Other variations are also contemplated.

FIG. 1B show a cross-sectional view of the inductor coil 100 illustrated in FIG. 1A along line A-A' prior to oxidation processing. Initially, the suspension columns 16 are formed of layers of a non-oxidizing metal, copper and a non-oxidizing, electrically conductive metal (in that order) patterned on the substrate 10. The first and second layers of non-oxidizing metal are patterned along with the coils 15a, 15b. The non-oxidizing metal may be gold or nickel, for example. Of course, other non-oxidizing metals could also be used for some applications.

The pillars 18 are initially formed of the same materials as the suspensions columns 16. However, while these elements may be formed of the same oxidizing metal, they have different dimensions/sizes which provide different oxidation behaviors of these elements when subjected to an oxidation process. As shown, the width (or diameter) of the pillars 18 is much greater than that of the suspension columns 16.

By performing an oxidation process, for instance, by exposing to a long oxygen plasma ash or by baking to high temperatures in the presence of oxygen, the narrower regions can selectively be converted entirely to copper oxide, an electrically insulating or resistive (non-conductive) material, while the larger or wider region continues to have a conductive copper core to connect the layers. After the oxidation process, the smaller copper regions with be converted into insulating pillars and the wider copper region will be a conductive electrical via in the electrical device. The gold layers are substantially unaffected by the oxidation process. Thus, electrical current can flow though the coil 15a, 15b generating an inductance therein.

FIG. 1C show a cross-sectional view of the inductor coil 100 illustrated in FIG. 1A taken line A-A' subsequent to oxidation processing. As will be appreciated, the suspension columns 16a, 16b, 16c, which central regions were initially formed of copper 17, have been completely converted to an insulating copper oxide 19a. Here, the copper oxide, an electrically insulating or resistive material, functions as a dielectric preventing shoring along columns 16a, 16b, 16c.

On the other hand, the pillars 18, which central regions were also initially formed of copper behave differently than the suspension columns 16. More particularly, given the greater width (or diameter) of the pillars 18 than the suspension columns 16, copper of the pillars 18 does not fully oxidize through its width. Rather, only small surface layer of copper oxide may be formed on the outer surface 19b of the pillars 18, enabling the pillars to be electrically conductive. The pillars 20 therefore can still substantially conduct electricity and enable low resistance electrical routing.

Creating mechanical supports in this manner using oxidation simplifies fabrication and obviates the need for the deposition and patterning of additional dielectric material which introduces further processing. In comparison to polymer or plastic support structures, the use of copper oxides can yield greater thermal stability, especially when a device is hermetically packaged. Polymers can also outgas and affect the device performance in the final package. In addition, both cupric and cuprous oxides have unusual properties that could allow new devices to be incorporated on-chip with MEMS structures. For example, cuprous oxide ($Cu_2O$) was an early semiconductor used in devices such as diodes before silicon became dominant, and continues to be used in certain specialized applications such as solar cells. Cupric oxide (CuO) has been demonstrated for chemical sensing and as a promising extremely high-k dielectric and ferroelectric material.

Copper Oxidation

Metallic copper may be thermally oxidized during an oxidizing process. The oxidation processing may include, for instance, a bake at an elevated temperature, exposure to oxygen plasma, or exposure to ozone. The oxidation of copper follows several distinct stages as the thickness of the oxide layer increases. The formation of the initial monolayers of oxide is linear with time, followed by a logarithmic behavior for thicknesses up to approximately one micrometer. For the elevated temperatures necessary for thick oxide growth, above 275° C., both of these stages occur in the first few minutes of oxidation. Although porous oxides can occur for a broad range of temperatures extending from 275° C. to over 1,000° C., an important region for MEMS structural supports is the low end of this range to minimize both mechanical stress and interdiffusion between the copper and the other metals used in the structural stack. Thick oxides grow in the temperature range from 275° C. to 400° C. according to a parabolic rate law:

$$Y^2 = k_p t + C \quad (1)$$

where Y is the mass gain per unit area, t is the oxidation time, $k_p$ is a parabolic rate constant and C is a constant.

For diffusion-based oxidation, the parabolic rate constant is guided by the Arrhenius relation:

$$k_p = K_0 e^{-E_a/RT} \quad (2)$$

where $K_0$ is a constant, $E_a$ is the activation energy, R is the ideal gas constant and T is the temperature.

The mass gain is proportional to the oxide thickness, after correcting for the volume expansion, leading to the expression:

$$Y = \rho_{oxide} d_{oxide} - \rho_{copper} \alpha_{volume} d_{oxide} \quad (3)$$

where $\rho_{oxide}$ and $\rho_{copper}$ are the densities of the copper oxide and copper, respectively, $\alpha_{volume}$ is a constant scaling factor to correct for the volume expansion, and $d_{oxide}$ is the oxide thickness. The conversion from copper to cuprous oxide, the primary oxide grown in this temperature range, results in a volume increase of 65%.

The thickness of the oxide will thus also follow an approximately parabolic law:

$$d_{oxide}^2 = \frac{k_p t + C}{(\rho_{oxide} - \rho_{copper}\alpha_{volume})^2} = k_{p,2} t + C_2 \quad (4)$$

where $k_{p,2}$ and $C_2$ are scaled constants.

To characterize the oxidation behavior, the inventors electroplated a 32 to 35 μm thick copper layer onto a copper seed layer in a copper sulfate electrolyte at a current density of 130 A/m² for 120 minutes. Titanium was used as an adhesion layer between the copper seed and the substrate. The wafer was then sectioned and each piece was baked in an air environment using a convection oven with temperature accuracy to within 10° C. The thickness was measured by masking a portion of the oxide with photoresist and removing the exposed oxide using diluted hydrochloric acid; the resulting step was then measured using a Tencor P-15 profilometer. An unoxidized copper piece was also etched using hydrochloric acid to verify that the diluted acid does not appreciably attack the copper.

Figure 2:
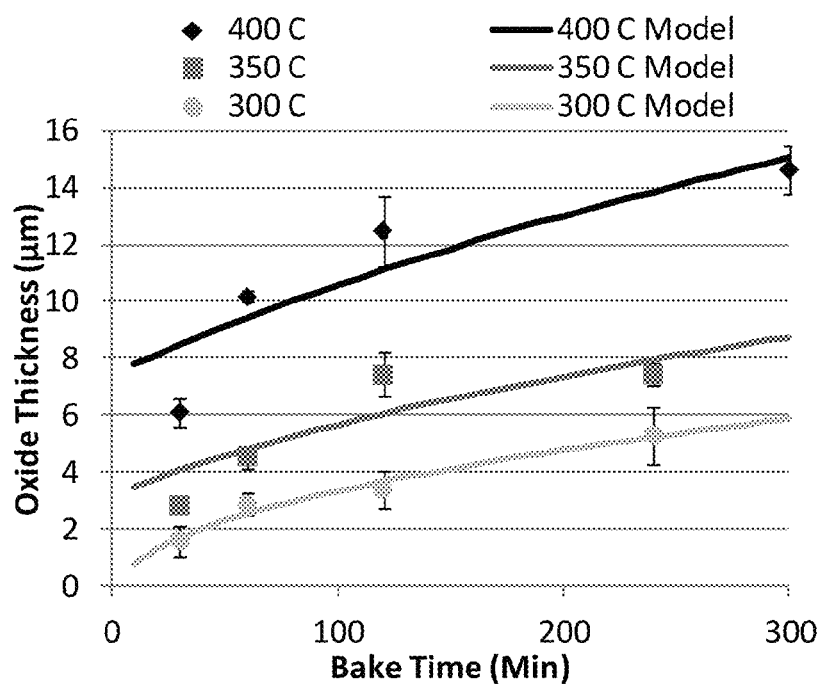
FIG. 2 is plot that shows oxide thicknesses growth at different temperatures and fitted.

FIG. 2 is plot that shows the oxide thicknesses grown for temperatures from 300° C. to 400° C. fitted to the parabolic model using equation (4). In all these cases, the grown oxide consisted of a thin black surface layer believed to be cupric oxide (CuO) above a thicker reddish cuprous oxide (Cu$_2$O) layer for the bulk of the oxide. This result is consistent with other reported copper oxides grown over a similar temperature range.

Figure 3:
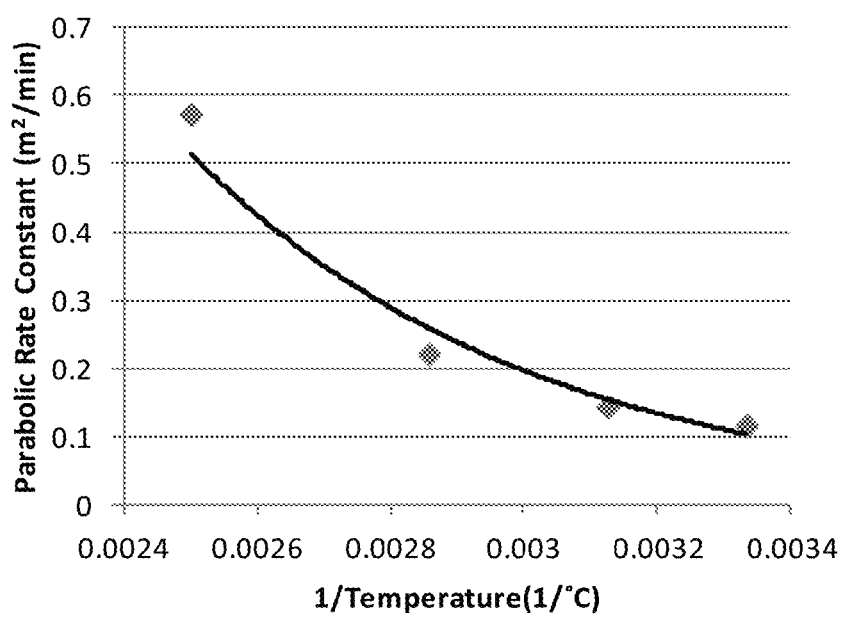
FIG. 3 is a plot that shows the parabolic rate constants were plotted and fitted.

FIG. 3 is a plot that shows the parabolic rate constants were plotted and fitted to an Arrhenius relation of equation (2) for an activation energy, $E_a$ of 16.0 kJ/mol. Previously, bulk copper had been reported to have activation energy near 70 kJ/mol in this temperature range with thin film copper in the 20 to 30 kJ/mol range, although there is significant variation based on both copper purity and oxide growth conditions. Unlike most comparable studies, which used highly purified copper, the inventors focused on copper electroplated on an adhesion layer as would be typically used in a practical MEMS device; baking at elevated temperatures would therefore result in a trace quantity of titanium diffusing into the copper. Although the effects of impure copper were not specifically investigated by the inventors, small quantities of impurities have been previously been demonstrated to either enhance or inhibit oxidation depending on a range of factors, and are a likely cause of the small variation from other published work. The inventors believe there is no reason why this would not also is the case with their invention.

Oxidation in Oxygen Plasma

In some embodiments, an excited plasma state enhances the reactivity of a gas, allows oxygen plasma to be used to rapidly oxidize metals. Oxidizing in oxygen plasma was investigated by the inventors, in particular, as an alternate method to the thermal oxidation previously discussed to create thick layers of oxide at lower temperatures to minimize film stress and diffusion. There have been a number of studies of the thin film oxidation of copper using oxygen plasma, largely for the creation of thin copper oxide films for solar cells, but to the inventors' knowledge, there has been no previous investigation of thick oxide growth using this method. Copper samples were oxidized using oxygen (O$_2$) plasma in an Anatech SCE-1000 barrel asher at 600 W, and a flow rate of 680 standard cubic centimeters per minute (sccm) O$_2$.

Figure 4:
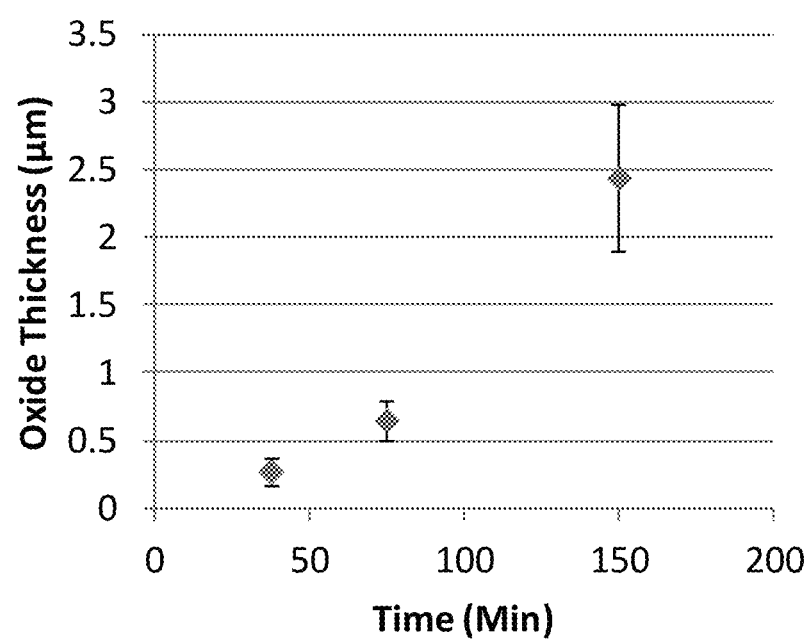
FIG. 4 shows the measured oxide thicknesses of the copper samples that were oxidized.

FIG. 4 shows the measured oxide thicknesses of the copper samples that were oxidized. The oxide was found to grow slowly, with oxide thicknesses of less than one micrometer for shorter O$_2$ plasma ashes and thick oxides developing only for very long exposures to high power oxygen plasma. As with the thermal oxidation, the oxide layer consisted of a thin black CuO layer above a thicker reddish Cu$_2$O. The rise in the oxide growth rate suggests that the growth is temperature dependent since the sample will progressively heat as it is exposed to the high energy plasma. The temperature profile of the Anatech system was also characterized and the temperature at the sample location was found to rise logarithmically for the first hour of plasma followed by saturation at approximately 120° C.

Oxidation of Mechanical Supports

To make pillars, posts, beams, columns, flexure structures or other released or suspended mechanical structures in the electrical device with copper oxides, a multi-layer, thick-film electroplating method was developed.

Figure 5:
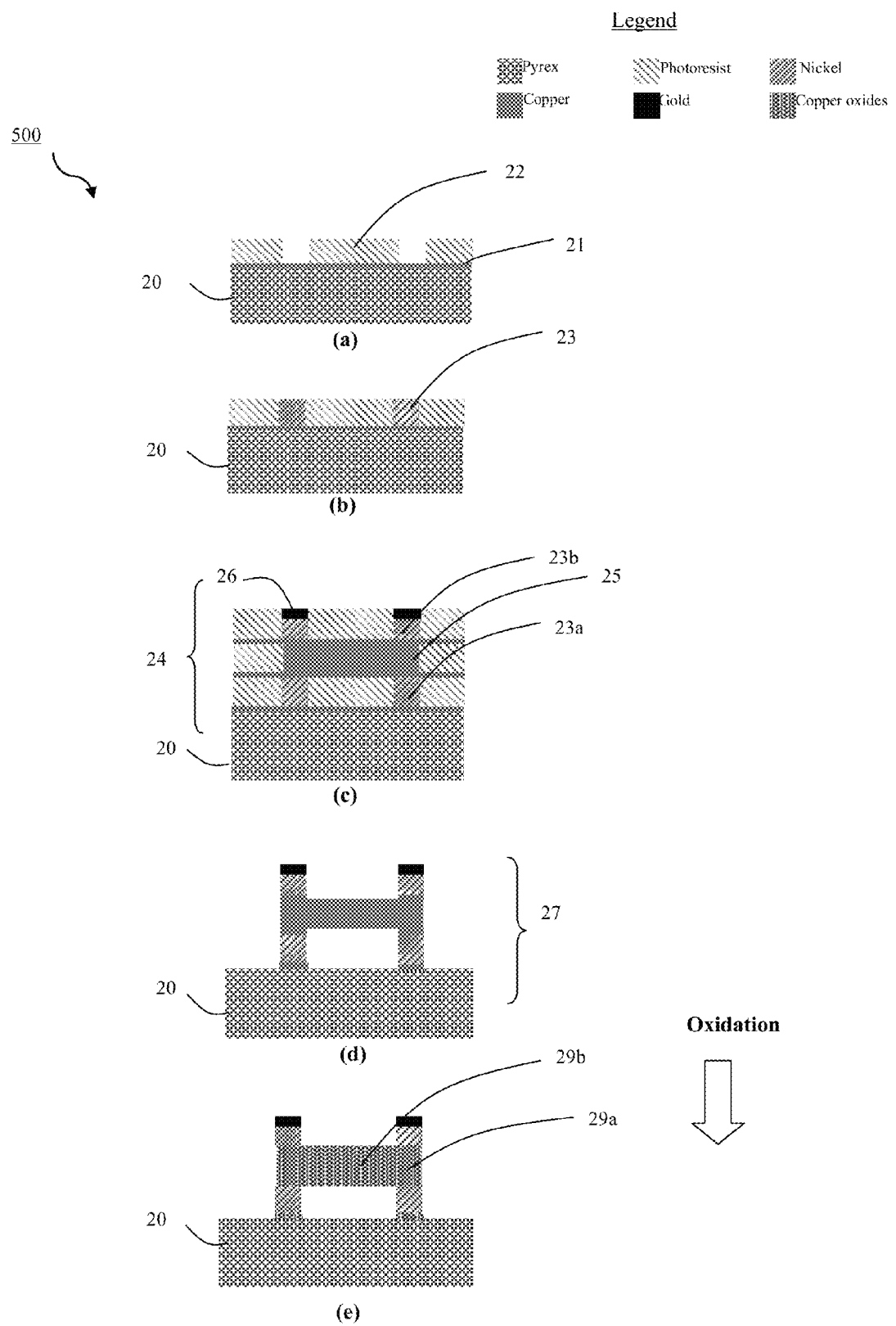
FIG. 5 shows a method for fabricating an electrical device according to an embodiment.

FIG. 5 shows a method 500 for fabricating an electrical device according to an embodiment. In step (a), a 3-nm-thick titanium adhesion layer (not shown) and a 200 nm copper seed layer 21 were first sputtered on a Pyrex® glass wafer substrate 20. Photoresist 22 is patterned on top of the copper seed layer 21. For instance, electroplating molds may be patterned in 10-μm-thick Clariant AZ9245 photoresist.

Next, in step (b), a non-oxidizing material 23 is electroplated over the photoresist mold. The non-oxidizing material 23 may be a metal such as nickel, for example. Other metals might also be used including gold, aluminum or platinum; although, non-metallic electrically conducive materials which do not readily oxidize might also be used, such as polysilicon. In step (c), this process is then repeated to create a multilayer layer stack 24. The multilayer stack 24 may include alternative layers of the non-oxidizing material 23 and an oxidizing metal 25 of copper. Here, the multilayer stack 24 is a three-layer stack consisting of nickel for the bottom layer 23a and the top layer 23b and copper for the middle layer 25 of the stack 24. The nickel layers may be plated from a nickel sulfamate bath, and the copper layer may be formed from a sulfuric acid/copper sulfate bath.

The multilayer stack 24 is provided with electrical contacts 26. Two such contacts 26 are shown. For instance, a gold layer several hundred nanometers thick may be either electroplated or deposited using electron beam evaporation on the surface of the top layer to form the electrical contacts 26.

In step (d), the structure is released. Different methods of release may be used, for instance. For instance, structures with narrow gaps such as inductors may be released by soaking in Baker PRS-3000 photoresist stripper for 35 minutes with ultrasonic agitation, followed by etching the titanium adhesion layer with hydrochloric acid. Since PRS-3000 is a mild copper etchant, the copper seed layers were etched along with the photoresist. On the other hand, for structures where dimension control may be more critical, an acetone release in ultrasonics was used, along with liftoff of the bottommost seed layer. The released structure 27 is shown comprised of alternating layers of the non-oxidizing metal and the oxidizing metal.

Between steps (d) and (e) an oxidation process is preformed on the release structure 27. The oxidation process may include a bake at an elevated temperature, exposure to oxygen plasma, or exposure to ozone. For example, the structure 27 may be baked in a convection oven to oxidize the oxidizing metal 18 (i.e. copper). Wider copper structures 29a are only partially oxidized, allowing conductive vias to be created whereas narrower copper structures 29b are fully oxidizing. The bottom two layers, the copper and nickel, were measured to have thicknesses of approximately 10 µm, and the top nickel/gold layer was measured to have a thickness of approximately 7 µm.

Nickel was used to minimize both interdiffusion with the copper and oxidation for the non-copper layers. Although nickel is capable of thick film oxidation at temperatures above 500° C., it forms a very thin self-limiting oxide (NiO), for instance tens of nanometers thick at lower temperatures. Nickel is commonly used as a diffusion barrier for copper since the two metals are not easily miscible.

Figure 6:
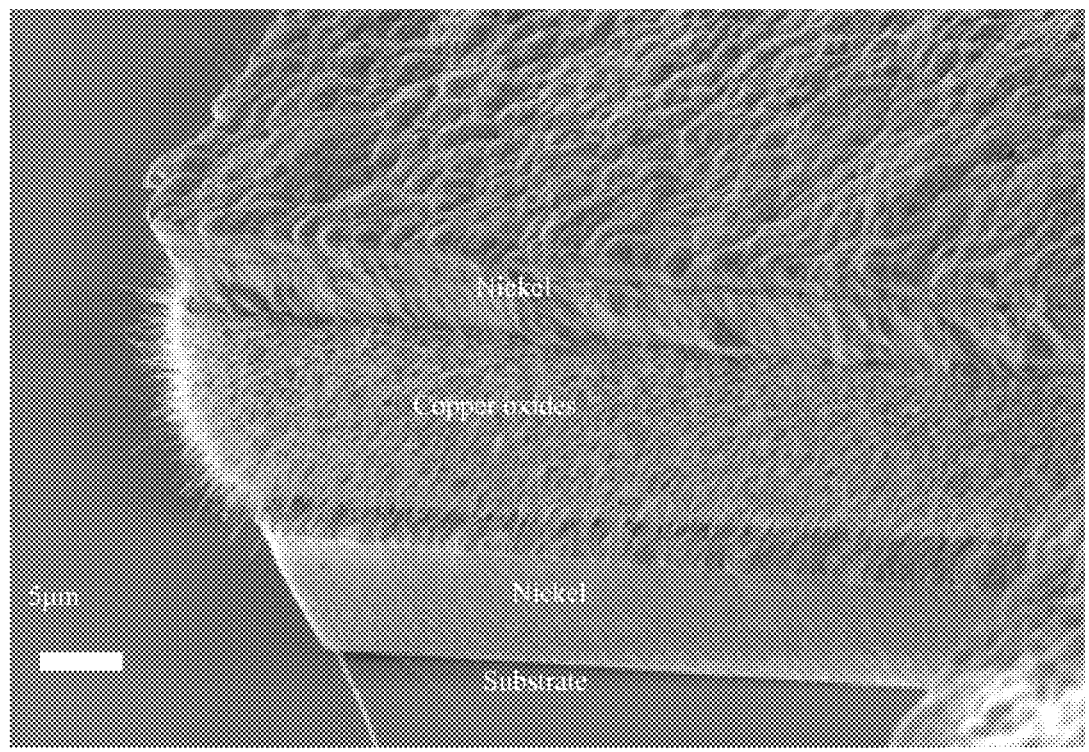
FIG. 6 is a scanning electron microscope (SEM) photograph of a nickel plate suspended on four pillars of copper oxide after oxidation.

FIG. 6 shows a nickel plate suspended on four pillars of copper oxide after oxidation for 5 hours at 400° C. FIG. 6(a) shows a schematic of the structure. FIG. 6(b) shows a SEM photograph of the structure from above.

Figure 7:
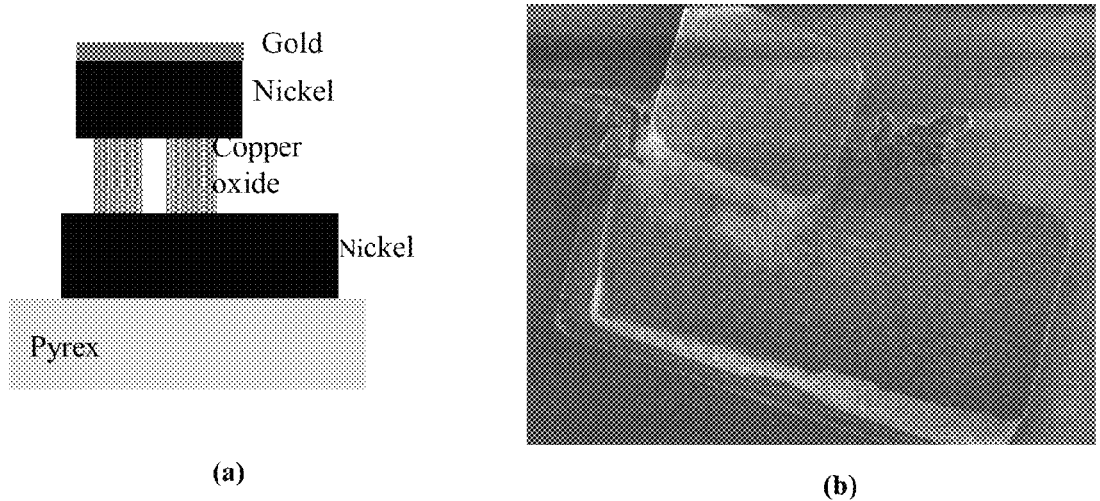
FIG. 7 shows a schematic of a large nickel-copper-nickel structure and SEM photograph of the structure after undergoing oxidation.

FIG. 7 shows a SEM photograph of a large nickel-copper-nickel structure after undergoing oxidation for 5 hours at 400° C. Before oxidation, the three layers were approximately aligned. In addition to the bowing outward of the copper oxide layer, due to the layer expansion, a large number of nanowires form on the surface, giving a furry appearance. These nanowires, which may be also referred to as whiskers, are characteristic of cupric oxide (CuO) growth during thermal oxidation.

Figure 8:
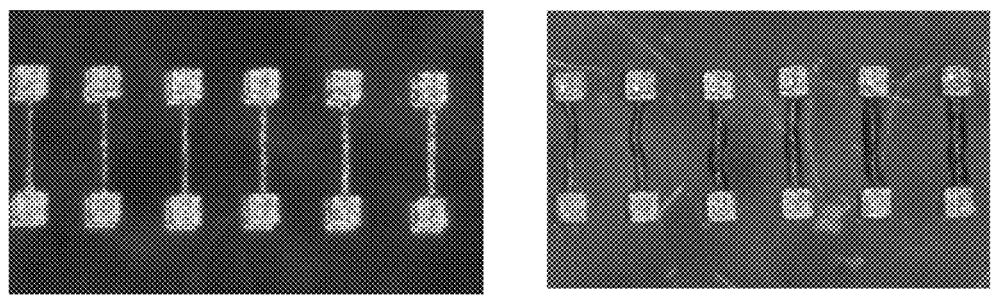
FIG. 8 shows SEM photographs of beams with different widths before and after oxidation.
Figure 8:
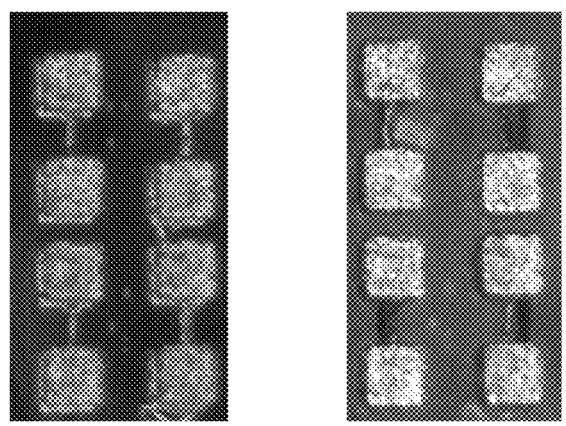
Figure 8:
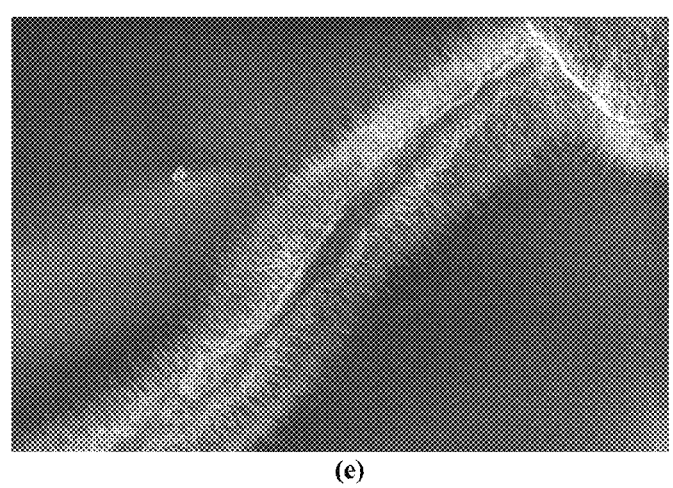

FIG. 8 shows SEM photographs of a series of 30 and 100 µm long beams with different widths before and after oxidation. The copper thickness is approximately 10 µm. FIGS. 8(a) and 8(c) show the 30 and 100 µm long beams, respectively, before the oxidation. FIGS. 8(b) and 8(d) show the same beams, respectively, after the oxidation. The narrow central regions of copper are converted to copper oxide, whereas the wider regions of copper (at the ends of the beam) largely remain metallic copper. Copper is known to expand upon oxidation, due to the addition of oxygen and the higher porosity of both common forms of copper oxide. As such narrower width beams can buckle during oxidation due to the residual stresses in the material. One example of the buckling of a 100 µm beam due to the residual stress in the layers is illustrated in more detail in the SEM photograph of FIG. 8(e). For a mechanical support, such as a pillar or a beam, the volume expansion is worthy of further consideration due to the additional stress and possible deformation of the supported structure.

Electrical Resistivity Measurements

Figure 9:
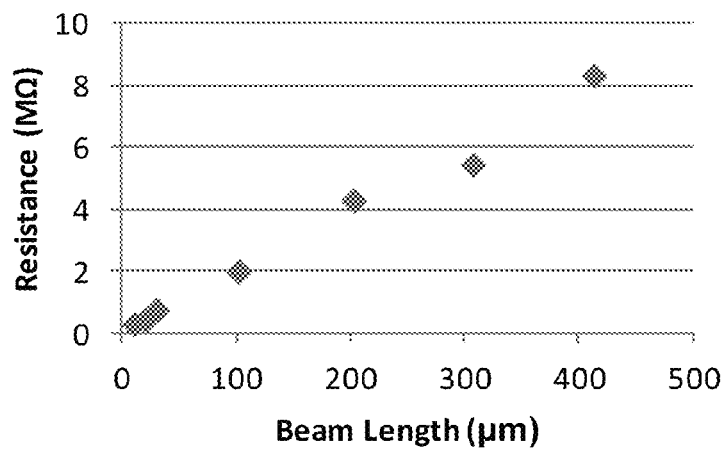
FIG. 9 shows a plot of the electrical resistance for beams of different lengths that were measured after oxidation.

FIG. 9 shows a plot of the electrical resistance for 4-µm wide beams of different lengths that were measured after oxidation at 400° C. for five hours. The longer beams were buckled and thus highly deformed; although the lengths shown include the deformation, there is a possibility that some of these beams included some partial breakage or other variation due to the large strain. Based on the oxidation rates and measured resistances the beams are believed to have oxidized completely and likely consist of a thin coating of CuO on a predominantly $Cu_2O$ beam. The average resistivity of the oxidized beams was found to be 129 Ω·cm, which is in the range demonstrated in the literature for bulk cuprous oxide. There was also buckling and deformation in the longer beams measured, which may account for some of the variation in the resistivity.

Suspended Structures

Figure 10:
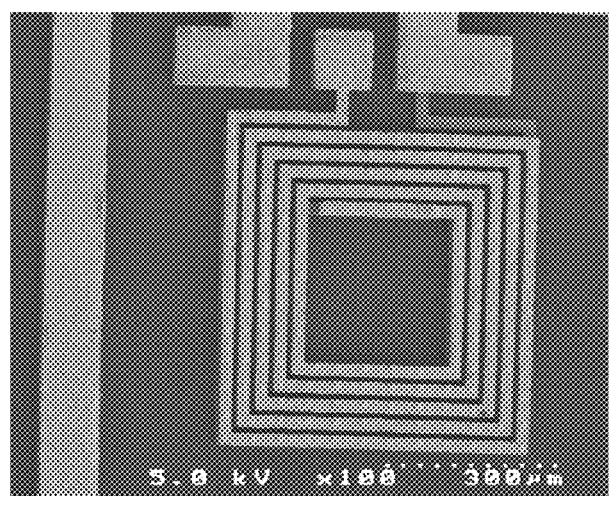
FIG. 10 shows two SEM photographs of a suspended inductor according to an embodiment.
Figure 10:
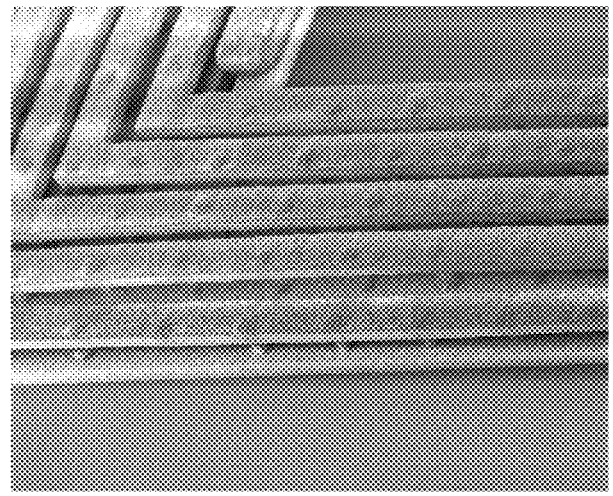

FIG. 10 shows two SEM photographs of a suspended inductor fabricated according to an embodiment. The inductor is suspended on square copper pillars 4 µm on a side, as shown in FIG. 10(a), was fabricated using the three layer nickel-copper-nickel process described above During fabrication, the metal layers were plated to a height slightly above the surface of the photoresist mold. This height difference resulted in a bump in the following layer, making the pillar locations clearly visible in FIG. 10 before oxidation. The top nickel layer is approximately 7 µm thick with a 0.5 µm gold layer on the top surface; the copper and bottom nickel layers are both 10 µm thick. The inductor was then baked in air for 5 hours at 400° C. to oxidize the copper. FIG. 10(b) shows the inductor after the oxidation. Shorter bake times were found to be insufficient for complete pillar oxidation. This deviation from the oxidation measurements may be due to interaction between the copper and the nickel/gold. Beams less than 20 µm in length, where the entire beam is closer to the nickel/gold cap, were found to require much longer oxidation times than expected before becoming highly resistive, while longer beams largely followed the model. The top surface was found to discolor slightly after oxidation, with the edges turning faintly purple, possibly due to small amounts of diffusion of copper or nickel into the top gold capping layer. Although some pillars were unable to survive either the photoresist mold release or oxidation process, resulting in some of the traces lifting slightly, most of the pillars remained intact.

The height profile was also measured using white light interferometry both before and after oxidation. Several traces were found to have a maximum out-of-plane deflection of approximately 2 to 3 µm. Since the vertical deflection of these traces was present before oxidation, the pillars in these regions were likely damaged during the photoresist release process, rather than during oxidation. The Baker PRS-3000 used during the release has been demonstrated to attack isolated micron-scale copper features. A comparable inductor on the same chip without pillars, measured before baking, was found to curl over 10 µm upward due to residual stresses.

Figure 11:
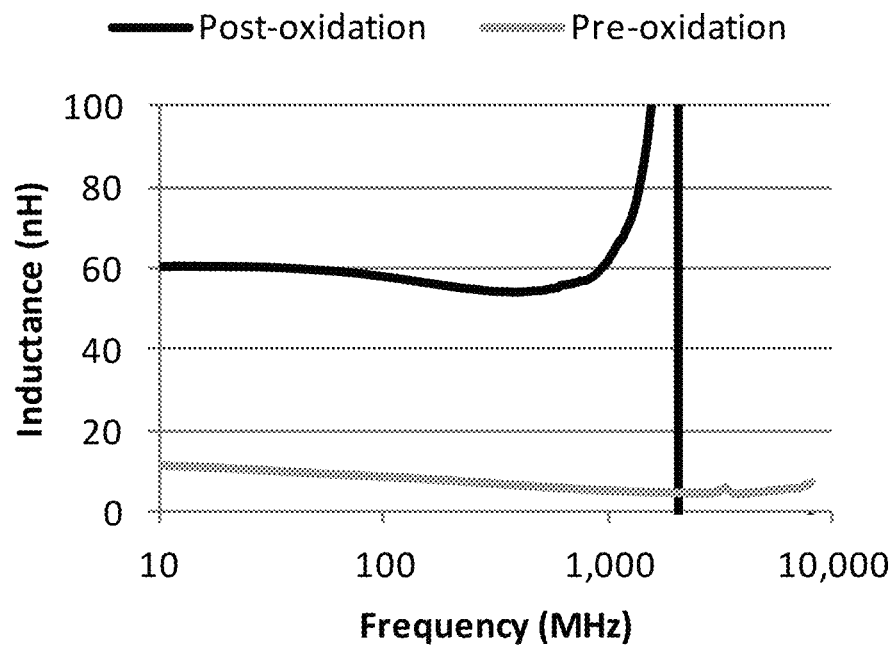
FIGS. 11 and 12 are plots showing electrical parameters of the inductor measured before and after oxidation, respectively.
Figure 12:
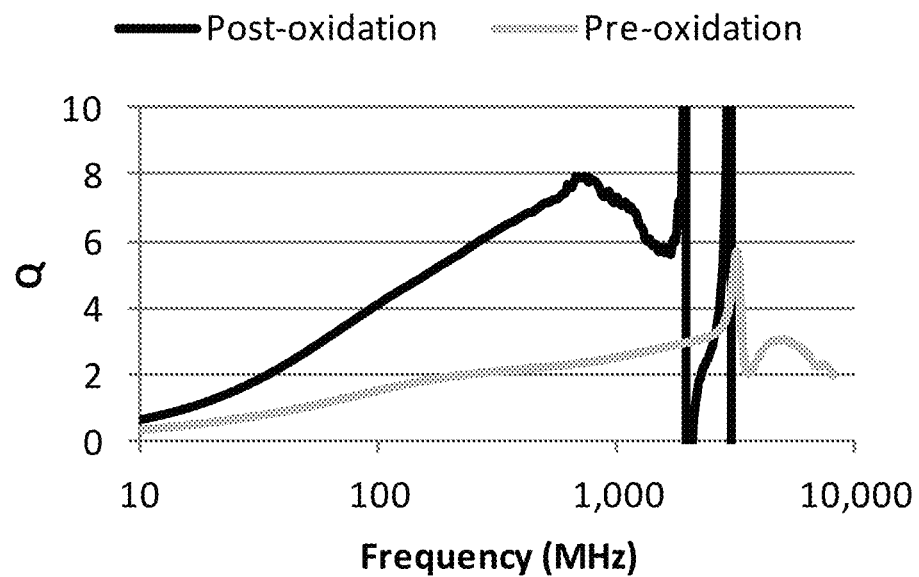

FIGS. 11 and 12 are plots showing electrical parameters of the inductor measured before and after oxidation, respectively. The measured low frequency inductance rose from approximately 10 nH to 60 nH upon oxidation; the pre-oxidation inductance results primarily from the traces where the pillars were completely etched away during release. The DC series resistance after baking was measured to be 6.0Ω, which is relatively high, largely due to the properties of nickel. The peak quality factor was 7.9 after oxidation.

In one or more embodiments, a selective copper oxidation technique may be employed within a multi-layer, electroplated metal process. This allows the introduction of a dielectric with minimal additional processing steps and reduces process complexities associated with the deposition and patterning of dielectrics. The oxidation behavior of electroplated copper was characterized and micron scale layers of copper oxides were obtained with oxidation as low as 300° C. A thick film nickel-copper-nickel electroplating process was developed and complete oxidation of copper posts and beams were obtained after baking for several hours at 400° C. The resistivity of the obtained copper oxide structures was found to be 129 Ω·cm.

A nickel inductor, suspended on high resistance posts, was fabricated by the inventors by controlled baking in a nickel-copper-nickel, thick-film electroplated process. The inductor was fabricated, characterized and found to have an inductance of approximately 60 nH. In the current process, nickel was used as a minimally oxidizing metal that does not interdiffuse with copper; however, nickel is also a higher resistivity magnetic material, resulting in higher DC resistance and moderate high frequency performance.

Similar devices might also be created using gold routing layers on copper oxide posts with electroplated nickel diffusion barriers between the copper and gold. Alternatively, the coating or alloying methods disclosed, for instance, in Li J, Mayer J, and Colgan E, "Oxidation and protection in copper and copper alloy thin films," *J. Appl. Phys.,* 70, (1991) 2820-2827, and Hutt D and Liu C, "Oxidation protection of copper surfaces using self-assembled monolayers of octadecanethiol," *Applied Surface Science,* 252 (2005) 400-411, could be used to selectively protect copper areas, allowing copper traces on copper oxide pillars to be successfully created. One possible method would be to encase the copper layers that are not intended to oxidize with an unoxidizing barrier metal using a process similar to the techniques used in damascene copper interconnects.

More particularly, both the conductive and electrically insulating or resistive elements may be formed from readily oxidizing metals, but the conducting element undergoes a surface treatment or coating to limit oxidation. For instance, the metallic element forming the electrically insulating or resistive element and the electrically conductive element may be differentiated by coating one or both of their surfaces. Regions could be coated with a layer of another material such as another metal to prevent the oxidizing metal from being exposed to oxygen during the oxidation process. The surface coating may include octadecanethiol or a non-oxidizing metal as an example.

Comparison with Conventionally Formed MEMS Structure

Thick film multi-layer metal electroplating processes may be used for creating low resistance structures for applications such as power inductors, as demonstrated in Meyer C. D. et al. "High-inductance-density, air-core, power inductors and transformers designed for operation at 100-500 MHz," *IEEE Trans. On Magnetics,* 46, (2005) 2236-2239. However, this process has several important disadvantages. In any metal electroplated released structure, the entire structure is electrically connected; this eliminates the possibility of a single structure containing, for instance, both actuation and sensing electrodes, limiting the possible types of devices that can be created. The use of completely oxidized metal to isolate different regions of the device opens up a large number of different possible applications for the process.

The fabrication process may also rely on photoresist pillars to hold released portions apart; this, though, may cause several important problems. Adding photoresist pillars generally requires an additional photolithography masking step, adding cost that would be unnecessary with the oxidation method. Photoresist is easily etched by many processing steps which are necessary to define the current multi-layer process. This limits the possible methods for release of the structure, and as a polymer does not have very desirable mechanical or electrical properties. Photoresist can also not be taken to high temperatures (e.g., above 150° C.) without being destroyed, limiting both process steps and uses for the final device. Embodiments of the present invention are believed to overcome these drawbacks.

FIG. 13 shows a schematic for a dual-proof mass gyroscope topology 1300 according to this conventional process for comparison sake. FIG. 13(*a*) shows the gyroscope before oxidation, and FIG. 13(*b*) show the same structure after oxidization. The gyroscope uses the oscillation of two proof masses with mechanical coupling but different applied voltages to measure the orientation. Here, both gold proof masses would automatically be shorted by the copper layer prior to oxidation as in FIG. 13(*a*). If the narrow copper bridge is oxidized, the two masses are electrically isolated and can be used as a functional device as in FIG. 13(*b*).

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, and to describe the actual partial implementation in the laboratory of the system which was assembled using a combination of existing equipment and equipment that could be readily obtained by the inventors, to thereby enable others skilled in the art to best utilize the invention and various embodiments with various modifications as may be suited to the particular use contemplated.

While the foregoing is directed to embodiments of the present invention, other and further embodiments of the invention may be devised without departing from the basic scope thereof, and the scope thereof is determined by the claims that follow. Each and every reference cited and/or discussed herein is hereby incorporated by reference in its entirety.

The invention claimed is:

1. A method of forming an electro-mechanical device using an oxidation process, the method comprising:
    forming a metallic element which is to become an electrically insulating or resistive element;
    forming an electrically conductive element, wherein the metallic element and the electrically conductive element have different oxidation behavior when subjected to the oxidation process; and
    subjecting the elements forming the electrically insulating or resistive element and the electrically conductive element to the oxidation process,
    whereby, in the electro-mechanical device formed using the oxidation process, one or both of the electrically insulating or resistive element and the electrically conductive element suspend an element of the electro-mechanical device, at least partially, above and spaced apart from a substrate or at least one other element of the electro-mechanical device,
    wherein the electrically conductive element provides an electrical pathway to the suspended element, and the electrically insulating or resistive element does not.

2. The method of claim 1, further comprising: subjecting one or both of the metallic element forming the electrically insulating or resistive element and the electrically conductive element to a release step whereby the suspended element becomes free-standing, suspended, or released from the substrate or the at least one other element of the electro-mechanical device.

3. The method of claim 2, wherein the metallic element forming the electrically insulating or resistive element forms a pillar, post, beam, column or flexure structure in the electro-mechanical device.

4. The method of claim 2, wherein the release step comprises: removing a supporting mold, etching of a sacrificial layer, or detachment from the substrate or at least one other element of the electro-mechanical device.

5. The method of claim 1, wherein one or both of the metallic element forming the electrically insulating or resistive element and the electrically conductive element are fabricated as a free-standing or suspended structure without an additional release step.

6. The method of claim 1, wherein the electrically conductive element is metallic.

7. The method of claim 1, wherein the electrically conductive element is a non-metallic conductor.

8. The method of claim 7, wherein the electrically conductive element is polysilicon.

9. The method of claim 1, wherein the metallic element forming the electrically insulating or resistive element is formed of a metal which readily oxidizes during the oxidation process.

10. The method of claim 9, wherein the metal which readily oxidizes during the oxidation process comprises copper, nickel, titanium, zirconium, hafnium, tantalum, or niobium.

11. The method of claim 9, wherein during the oxidation process, the metal is substantially converted to an oxide of the metal.

12. The method of claim 9, wherein during the oxidation process, a portion of the metal is converted to an oxide of the metal and another portion thereof remains substantially the metal.

13. The method of claim 1, wherein the metallic element forming the electrically insulating or resistive element and the electrically conductive element are each formed from a metal which readily oxidizes during the oxidation process.

14. The method of claim 13, wherein the electrically conductive element has a greater thickness or diameter than the metallic element forming the electrically insulating or resistive element.

15. The method of claim 14, wherein during the oxidation process, only a surface layer of the metal of the conductive element is converted to a metal oxide.

16. The method claim 1, wherein the electrically conductive element is formed of a metal which does not readily oxidize during the oxidation process.

17. The method of claim 16, wherein the metal comprises gold, nickel, aluminum, or platinum.

18. The method of claim 1, wherein the oxidation process comprises: a bake at an elevated temperature, exposure to oxygen plasma, or exposure to ozone.

19. The method of claim 1, wherein the electro-mechanical device is configured as an inductor, gyroscope, accelerometer, chemical sensor, pressure sensor, or variable capacitor.

20. The method of claim 1, wherein the metallic element forming the electrically insulating or resistive element and the electrically conductive element are differentiated by coating a surface of the conductive element.

21. The method of claim 20, wherein the surface coating comprises: octadecanethiol or a non-oxidizing metal.

22. The method of claim 1, wherein the metallic element forming the electrically insulating or resistive element, the electrically conductive element, or both, are deposited by electroplating.

23. An electro-mechanical device formed by the method of claim 1 comprising:
the electrically insulating or resistive element formed from the metallic element; and
the electrically conductive element,
whereby one or both of the electrically insulating or resistive element and the electrically conductive element suspend an element of the electro-mechanical device formed by the oxidation process, at least partially, above and spaced apart from the substrate or the at least one other element of the electro-mechanical device,
wherein the metallic element and the electrically conductive element have different oxidation behavior when subjected to the oxidation process such that the electrically conductive element provides an electrical pathway to the suspended element, and the electrically insulating or resistive element formed from the metallic element does not.

24. The method of claim 1, wherein the electrically conductive element is connected to the metallic element.

25. A method of forming an electrical device using an oxidation process, the method comprising:
forming a metallic element which is to become an electrically insulating or resistive element;
forming an electrically conductive element, wherein the metallic element and the electrically conductive element have different oxidation behavior when subjected to the oxidation process; and
subjecting the elements forming the electrically insulating or resistive element and the electrically conductive element to the oxidation process,
whereby, in the electrical device formed using the oxidation process, one or both of the electrically insulating or resistive element and the electrically conductive element suspend an element of the electro-mechanical device, at least partially, above and spaced apart from a substrate or at least one other element of the electrical device,
wherein the electrically conductive element provides an electrical pathway to the suspended element, and the electrically insulating or resistive element does not.

* * * * *